United States Patent
Lozhkin

(10) Patent No.: US 9,559,638 B2
(45) Date of Patent: Jan. 31, 2017

(54) DISTORTION COMPENSATION APPARATUS AND DISTORTION COMPENSATION METHOD

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/690,692

(22) Filed: Apr. 20, 2015

(65) Prior Publication Data
US 2015/0365056 A1 Dec. 17, 2015

(30) Foreign Application Priority Data
Jun. 12, 2014 (JP) .................................. 2014-121753

(51) Int. Cl.
H03F 1/26 (2006.01)
H03F 1/32 (2006.01)
H03F 3/24 (2006.01)

(52) U.S. Cl.
CPC .......... *H03F 1/3247* (2013.01); *H03F 1/3258* (2013.01); *H03F 3/24* (2013.01)

(58) Field of Classification Search
CPC .................................. H03F 1/26; H03F 1/3247
USPC ........................................ 330/149; 455/114.3
See application file for complete search history.

(56) References Cited

U.S. PATENT DOCUMENTS 6,437,644 B1 8/2002 Kenington
9,093,958 B2 * 7/2015 Asensio ................ H03F 1/3241

FOREIGN PATENT DOCUMENTS

JP H07-066687 3/1995

OTHER PUBLICATIONS

Hsin-Hung Chen et al., "Joint Polynomial and Look-Up-Table Predistortion Power Amplifier Linearization", IEEE Transactions on Circuits and Systems-II: Express Briefs, vol. 53, No. 8, Aug. 2006, pp. 612-616 (5 pages).
Yoshihiko Akaiwa, "Introduction to Digital Mobile Communication", Signal and Noise Analysis, 1997, (3 pages).
Lei Ding et al., "A Robust Digital Baseband Predistorter Constructed Using Memory Polynomials", IEEE Transactions on Communictions, vol. 52, No. 1, Jan. 2004, pp. 159-165 (7 pages).
Frederic Roger, "An Analog Approach to Power Amplifier Predistortion", Special Report, Microwave Journal, Apr. 2011, pp. 60, 62, 64, 66, 68, 70, 72, 74 and 76 (9 pages).

* cited by examiner

*Primary Examiner* — Steven J Mottola
(74) *Attorney, Agent, or Firm* — Fujitsu Patent Center

(57) ABSTRACT

A distortion compensation apparatus includes a calculation unit that acquires, from calculation performed by using a factor and an output signal from the amplifier, a distortion component that is associated with the distortion generated in the amplifier, and a comparing unit that compares a signal that is obtained by giving the distortion component acquired by the calculation unit to an output signal output from the amplifier, with an input signal input to the amplifier, to which a distortion component is previously given. The calculation unit adjusts, on the basis of a comparison result obtained by the comparing unit, the factor that is used for the calculation.

10 Claims, 4 Drawing Sheets

DISTORTION COMPENSATION APPARATUS AND DISTORTION COMPENSATION METHOD

CROSS-REFERENCE TO RELATED APPLICATION

This application is based upon and claims the benefit of priority of the prior Japanese Patent Application No. 2014-121753, filed on Jun. 12, 2014, the entire contents of which are incorporated herein by reference.

FIELD

The embodiment discussed herein is directed to a distortion compensation apparatus and a distortion compensation method.

BACKGROUND

In general, amplifiers that amplify transmission signals are provided in wireless communication apparatuses, such as base station apparatuses. Normally, if an input level to an amplifier is relatively small, the linearity of an input and an output of signals is maintained, whereas, if an input level to an amplifier increases and an output level thus approaches the saturation level, an input and an output of signals become nonlinear due to inter modulation distortion. Consequently, when an amplifier is operated at around the saturation level in which the power efficiency is high, the amplifier needs to be operated in a nonlinear region in which an input and an output of signals become nonlinear.

When an amplifier is operated in a nonlinear region, it is preferable that a distortion compensation circuit that compensates the inter modulation distortion generated in the amplifier be provided in a wireless communication apparatus. Specifically, by compensating, using a distortion compensation circuit, inter modulation distortion that is generated at the time of amplification, it is possible to maximize the performance of the amplifier. In recent years, predistortion circuits are widely used as distortion compensation circuits.

A predistortion circuit compensates inter modulation distortion by previously distorting an input signal that is input to an amplifier. Specifically, distortion that has the inverse characteristic of inter modulation distortion generated in the amplifier is previously given to an input signal, distortion of the input signal is canceled out by inter modulation distortion that is actually generated in the amplifier and thus the input/output linearity is improved. When distortion given to an input signal is calculated, in some cases, for example, a memory polynomial calculation is performed. Specifically, by performing the memory polynomial calculation, a feedback signal from an amplifier is compared with an input signal to the amplifier and then distortion given to the input signal is adjusted.

Patent document 1: U.S. Pat. No. 6,437,644

However, in order to perform the calculation that uses the memory polynomial, there is a problem in that a circuit becomes complicated and the size of the device and the cost are increased. Specifically, when, for example, a feedback signal from an amplifier is represented by a memory polynomial, a bit resolution in accordance with the level of a feedback signal is needed. At this point, because the dynamic range of the feedback signal is relatively large, the number of bits that represents the level of the feedback signal tends to increase. Consequently, because a circuit that is used to perform predistortion becomes complicated or the processing amount of the circuit increases, the size of the device and the cost increase.

SUMMARY

According to an aspect of an embodiment, a distortion compensation apparatus compensates distortion generated in an amplifier that amplifies an input signal. The distortion compensation apparatus includes a calculation unit that acquires, from calculation performed by using a factor and an output signal from the amplifier, a distortion component that is associated with the distortion generated in the amplifier, and a comparing unit that compares a signal that is obtained by giving the distortion component acquired by the calculation unit to an output signal output from the amplifier, with an input signal input to the amplifier, to which a distortion component is previously given. The calculation unit adjusts, on the basis of a comparison result obtained by the comparing unit, the factor that is used for the calculation.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Note that the embodiments are not intended to limit the present invention.

Figure 1:
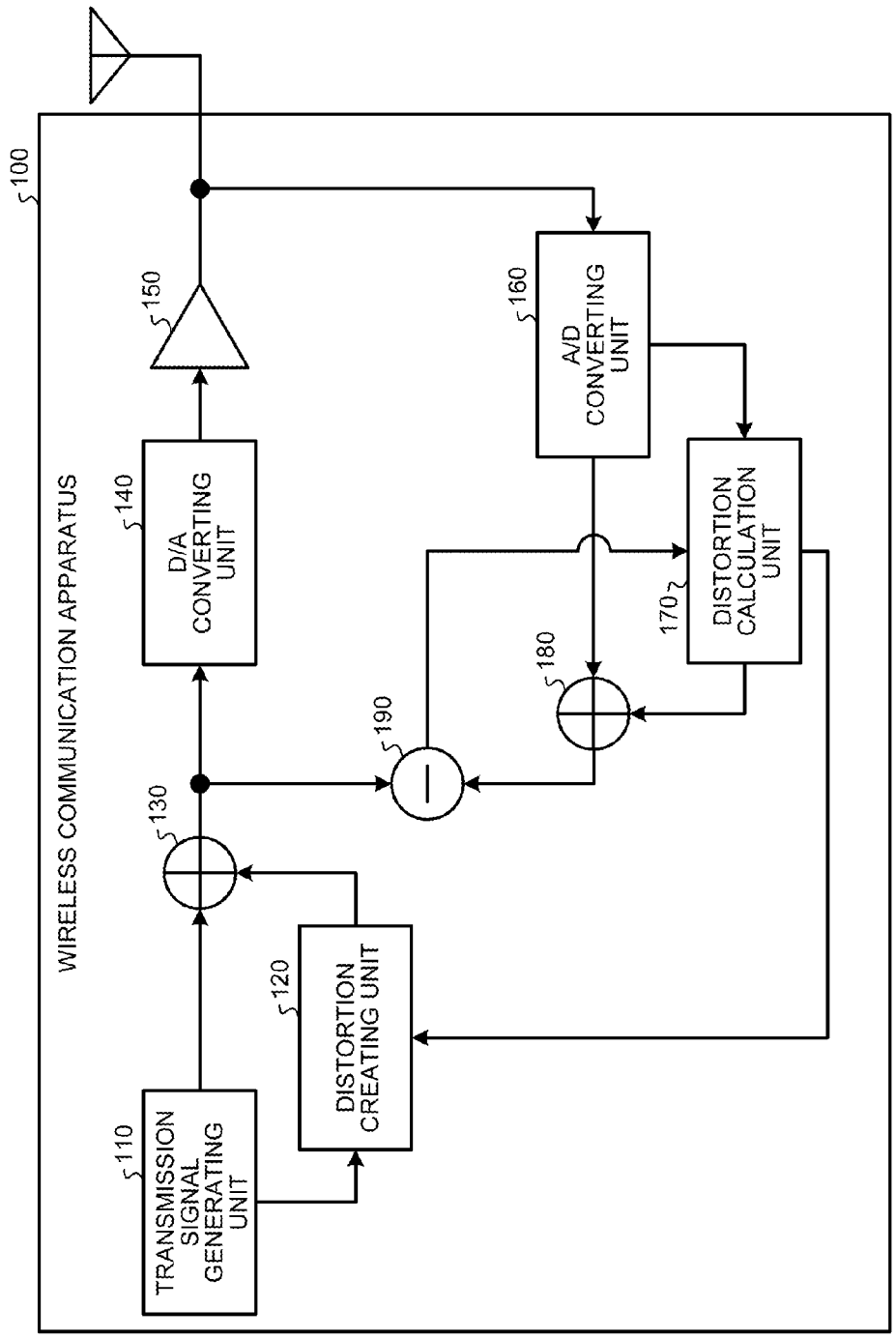
FIG. 1 is a block diagram illustrating the configuration of a wireless communication apparatus according to an embodiment.

FIG. 1 is a block diagram illustrating the configuration of a wireless communication apparatus 100 according to an embodiment. The wireless communication apparatus 100 illustrated in FIG. 1 includes a transmission signal generating unit 110, a distortion creating unit 120, an adder 130, a digital to analogue (D/A) converting unit 140, an amplifier 150, an analogue to digital (A/D) converting unit 160, a distortion calculation unit 170, an adder 180, and a subtractor 190.

The transmission signal generating unit 110 generates a transmission signal that includes various kinds of user information and control information. The transmission signal generating unit 110 outputs the generated transmission signal to the distortion creating unit 120 and the adder 130.

By using a transmission signal that is output from the transmission signal generating unit 110 and by using a weighting factor acquired from the distortion calculation unit 170, the distortion creating unit 120 generates a distortion component that has the inverse characteristic of inter modulation distortion generated in the amplifier 150. Specifically, the distortion creating unit 120 creates a distortion component based on, for example, a memory polynomial (1) as below:

$$z(n) = \sum_{k=1}^{K} \sum_{q=0}^{Q} a_{kq} \cdot x(n-q) \cdot |x(n-q)|^{k-1}, \qquad (1)$$

where z(n) represents a transmission signal to which distortion is given at time n, x(n) represents a transmission signal at time n, $a_{kq}$ represents a weighting factor, K represents the maximum order of assumed inter modulation distortion, and Q represents the depth of a memory. Equation (1) can be transformed to Equation (2) as below:

$$z(n) = x(n) + \sum_{k=2}^{K} \sum_{q=0}^{Q} a_{kq} \cdot x(n-q) \cdot |x(n-q)|^{k-1} \qquad (2)$$

Specifically, a transmission signal z(n) to which distortion is given is represented by the sum of a transmission signal x(n) and a distortion component. Accordingly, the distortion creating unit 120 calculates a distortion component obtained when the distortion component is calculated by using Equation (2). At this point, the distortion creating unit 120 calculates a distortion component by using a weighting factor $a_{kq}$ that is acquired from the distortion calculation unit 170. The distortion component calculated in this way is associated with inter modulation distortion that is generated in the amplifier 150. If a suitable value is set to the weighting factor $a_{kq}$, the inter modulation distortion generated in the amplifier 150 can be canceled out.

The adder 130 adds a transmission signal that is output from the transmission signal generating unit 110 to the distortion component created by the distortion creating unit 120. Specifically, the adder 130 outputs a signal that corresponds to z(n) in Equation (2).

The D/A converting unit 140 performs D/A conversion on a transmission signal to which distortion is given and outputs the obtained analog transmission signal to the amplifier 150.

The amplifier 150 amplifies a transmission signal. At this point, in the amplifier 150, inter modulation distortion is given to the transmission signal. Because the inter modulation distortion generated in the amplifier 150 is canceled out by a distortion component created by the distortion creating unit 120, the amplifier 150 outputs a transmission signal in which distortion is suppressed. Then, the transmission signal output from the amplifier 150 is sent via an antenna.

The A/D converting unit 160 performs the A/D conversion on a feedback signal (hereinafter, referred to as an "FB signal") that is output from and fed back to the amplifier 150. Then, the A/D converting unit 160 outputs the obtained digital FB signal to the distortion calculation unit 170 and the adder 180.

The distortion calculation unit 170 creates, on the basis of an FB signal output from the A/D converting unit 160, a distortion component that has the inverse characteristic of inter modulation distortion that is generated in the amplifier 150. Specifically, the distortion calculation unit 170 creates a distortion component by using the same memory polynomial as Equation (1) described above. More specifically, the distortion calculation unit 170 calculates a distortion component by using Equation (3) below:

$$IMD(n) = \sum_{k=2}^{K} \sum_{q=0}^{Q} a_{kq} \cdot y(n-q) \cdot |y(n-q)|^{k-1}, \qquad (3)$$

where IMD(n) represents a distortion component at time n and y(n) represents an FB signal at time n. At this point, the distortion calculation unit 170 calculates a distortion component, on the basis of Equation (3), by adjusting the weighting factor $a_{kq}$ such that the difference output from the subtractor 190 is small. Specifically, the distortion calculation unit 170 repeatedly adjusts the weighting factor $a_{kq}$ such that a transmission signal, to which a distortion component created by the distortion creating unit 120 is given, and an FB signal, to which a distortion component created by the distortion calculation unit 170 is given, are the same. Then, if an environmental condition, such as a temperature, is significantly changed from a predetermined reference or if a predetermined time period has elapsed, the distortion calculation unit 170 copies the adjusted weighting factor $a_{kq}$ to the distortion creating unit 120.

The adder 180 adds an FB signal that is output from the A/D converting unit 160 to a distortion component that is created by the distortion calculation unit 170. Specifically, the adder 180 outputs a signal corresponding to z*(n) indicated by Equation (4) as below:

$$z*(n) = y(n) + IMD(n) \qquad (4)$$

$$= y(n) + \sum_{k=2}^{K} \sum_{q=0}^{Q} a_{kq} \cdot y(n-q) \cdot |y(n-q)|^{k-1}$$

The subtractor 190 calculates the difference between a transmission signal that is output from the adder 130 and an FB signal that is output from the adder 180. Specifically, the subtractor 190 calculates the difference between a transmission signal and an FB signal to each of which a distortion component having the inverse characteristic of the inter modulation distortion that is generated in the amplifier 150 is given. Then, the subtractor 190 outputs the calculated difference to the distortion calculation unit 170.

At this point, if the distortion component created by the distortion creating unit 120 is ideal and is a distortion component that is an inverse of the inter modulation distortion generated in the amplifier 150, the transmission signal output from the amplifier 150 is not distorted. Consequently, in an ideal state, the transmission signal created by the transmission signal generating unit 110 matches the FB signal that is output from the amplifier 150 and that is fed back. Furthermore, in an ideal state, because the distortion components created by the distortion creating unit 120 and the distortion calculation unit 170 are also the same, the difference calculated by the subtractor 190 is zero. Consequently, the distortion calculation unit 170 repeatedly adjusts the weighting factor $a_{kq}$ such that the difference calculated by the subtractor 190 approaches zero.

In the following, an example configuration of the distortion calculation unit 170 will be described with reference to FIG. 2. A description will be given of an example configuration of the distortion calculation unit 170 when the maximum order K of the assumed inter modulation distortion is 3 and the depth Q of a memory is 1.

Figure 2:
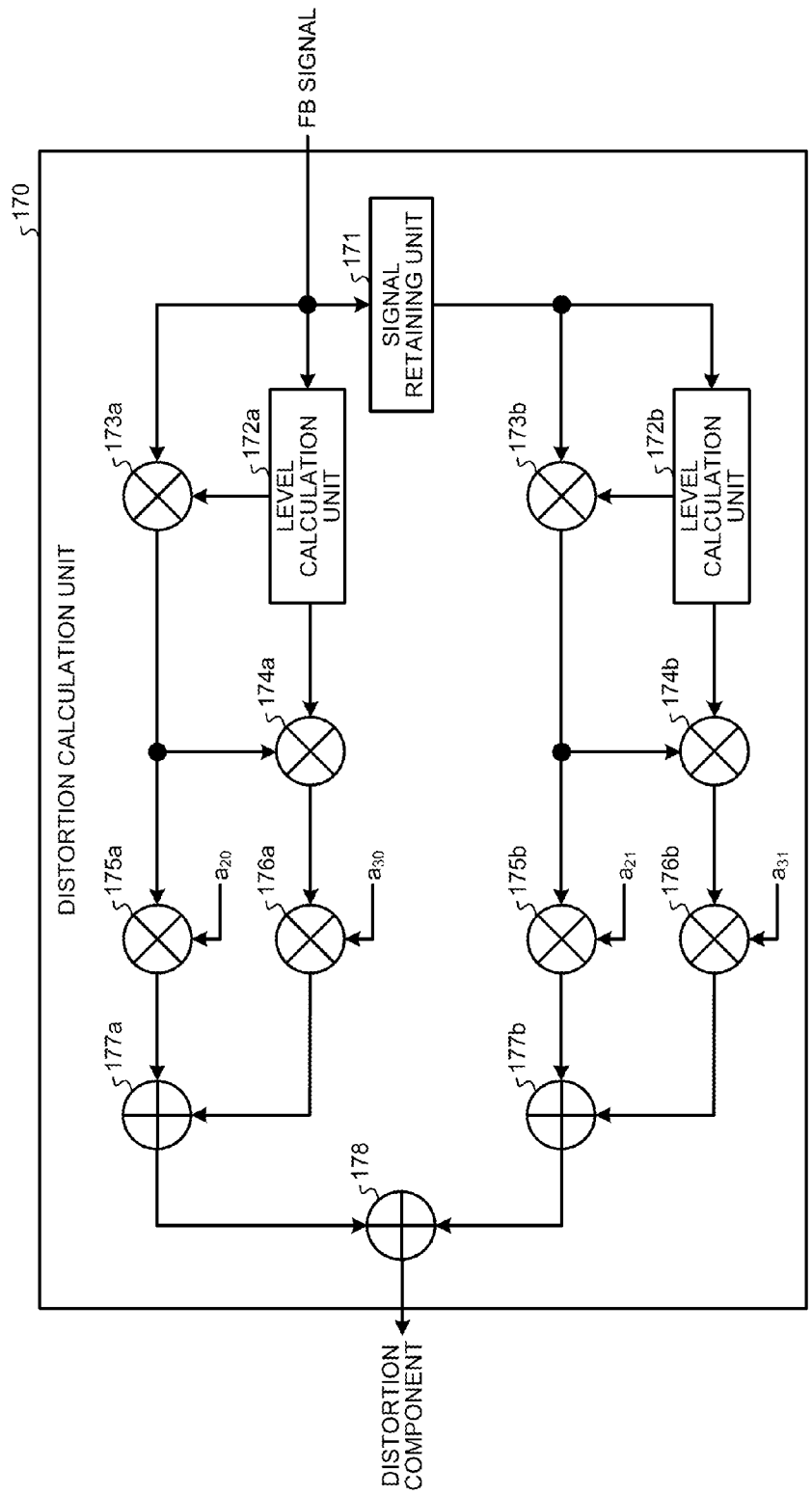
FIG. 2 is a block diagram illustrating an example configuration of a distortion calculation unit according to an embodiment.

As illustrated in FIG. 2, the distortion calculation unit 170 includes a signal retaining unit 171, level calculation units 172a and 172b, multipliers 173a to 176a, multipliers 173b to 176b, adders 177a and 177b, and an adder 178.

The signal retaining unit 171 retains an input FB signal for a time period that corresponds to a single sample. Specifically, the signal retaining unit 171 delays an FB signal by an amount corresponding to one sample and then outputs the FB signal to the level calculation unit 172b and the multiplier 173b. Accordingly, when an FB signal at time n is input to the distortion calculation unit 170, the signal retaining unit 171 retains the FB signal that is input at time n and then outputs an FB signal at time (n−1) to the level calculation unit 172b and the multiplier 173b.

The level calculation unit 172a calculates the level of the input FB signal and then outputs the calculated level to the multipliers 173a and 174a. Specifically, the level calculation unit 172a calculates |y(n)| in Equation (3).

The multiplier 173a multiplies the input FB signal by the level that is calculated by the level calculation unit 172a and then outputs the multiplication result to the multipliers 174a and 175a. Specifically, the multiplier 173a calculates y(n)·|y(n)| indicated by Equation (3).

The multiplier 174a multiplies the multiplication result that is obtained by the multiplier 173a by the level that is calculated by the level calculation unit 172a and then outputs the multiplication result to the multiplier 176a. Specifically, the multiplier 174a calculates y(n)·|y(n)| indicated by Equation (3).

The multiplier 175a multiplies the multiplication result obtained by the multiplier 173a by the weighting factor $a_{20}$ and then outputs the multiplication result to the adder 177a. Specifically, the multiplier 175a calculates the term $a_{20}$·y(n)·|y(n)| when k is 2 and q is 0 in Equation (3). At this point, the weighting factor $a_{20}$ is adjusted such that the difference calculated by the subtractor 190 is small.

The multiplier 176a multiplies the multiplication result obtained by the multiplier 174a by the weighting factor $a_{30}$ and then outputs the multiplication result to the adder 177a. Specifically, the multiplier 176a calculates the term $a_{30}$·y(n)·|y(n)|$^2$ when k is 3 and q is 0 in Equation (3). At this point, the weighting factor $a_{30}$ is adjusted such that the difference calculated by the subtractor 190 is decreased.

The adder 177a adds the multiplication result obtained by the multiplier 175a to the multiplication result obtained by the multiplier 176a and then outputs the addition result to the adder 178. Specifically, the adder 177a calculates the term on the right side of Equation (3) when q is zero.

The level calculation unit 172b calculates the level of an input FB signal and then outputs the calculated level to the multipliers 173b and 174b. Specifically, the level calculation unit 172b calculates |y(n−1)| in Equation (3).

The multiplier 173b multiplies the input FB signal by the level that is calculated by the level calculation unit 172b and then outputs the multiplication result to the multipliers 174b and 175b. Specifically, the multiplier 173b calculates y(n−1)·|y(n−1)| in Equation (3).

The multiplier 174b multiplies the multiplication result obtained by the multiplier 173b by the level calculated by the level calculation unit 172b and then outputs the multiplication result to the multiplier 176b. Specifically, the multiplier 174b calculates y(n−1)·|y(n−1)|$^2$ in Equation (3).

The multiplier 175b multiplies the multiplication result obtained by the multiplier 173b by the weighting factor $a_{21}$ and then outputs the multiplication result to the adder 177b. Specifically, the multiplier 175b calculates the term $a_{21}$·y(n−1)·|y(n−1)| in Equation (3) when k is 2 and q is 1. At this point, the weighting factor $a_{21}$ is adjusted such that the difference calculated by the subtractor 190 is small.

The multiplier 176b multiplies the multiplication result obtained by the multiplier 174b by the weighting factor $a_{31}$ and then outputs the multiplication result to the adder 177b. Specifically, the multiplier 176b calculates the term $a_{31}$·y(n−1)·|y(n−1)|$^2$ in Equation (3) when k is 3 and q is 1. At this point, the weighting factor $a_{31}$ is adjusted such that the difference calculated by the subtractor 190 is small.

The adder 177b adds the multiplication result obtained by the multiplier 175b to the multiplication result obtained by the multiplier 176b and then outputs the addition result to the adder 178. Specifically, the adder 177b calculates the term on the right side of Equation (3) when q is 1.

The adder 178 adds the addition result obtained by the adder 177a to the addition result obtained by the adder 177b, whereby the adder 178 calculates a distortion component. Specifically, the adder 178 calculates each of the terms in Equation (3) when k is 2 and 3 and when q is 0 and 1, whereby the adder 178 calculates a distortion component IMD (n).

In this way, in the embodiment, the distortion calculation unit 170 performs calculation on the basis of the memory polynomial and calculates a distortion component. Then, the weighting factor $a_{kq}$ is adjusted in a process of calculation performed on the distortion component by the distortion calculation unit 170. In other words, the weighting factor $a_{kq}$ is adjusted by performing the calculation targeted for a relatively small distortion component without performing calculation targeted for all of the FB signals whose level is relatively large. Consequently, it is possible to prevent an increase in the number of bits used for the calculation and it is possible to suppress a circuit from becoming complicated and an increase in an amount of processing.

Figure 3:
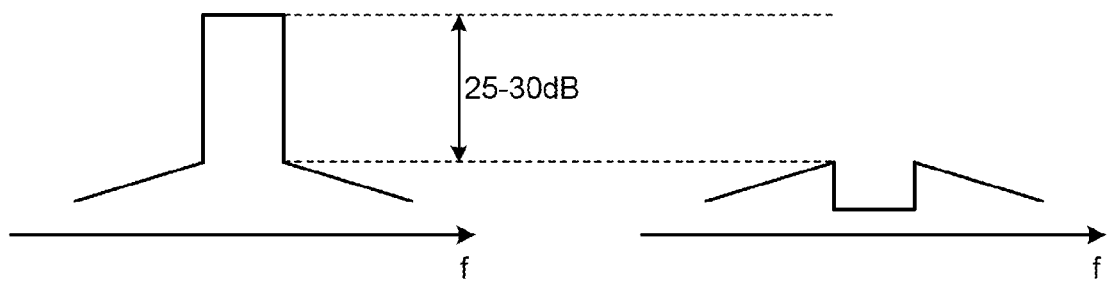
FIG. 3 is a schematic diagram illustrating comparison between a feedback signal and the level of a distortion component.

FIG. 3 is a schematic diagram illustrating comparison between a feedback signal and the level of a distortion component. In general, the level of the distortion component illustrated on the right side in FIG. 3 is smaller than that illustrated on the left side in FIG. 3 by about 25 to 30 dBs. Furthermore, normally, because the difference of the level of 6 dBs corresponds to 1 bit, the difference of the level of 30 dBs corresponds to 5 bits. Specifically, the distortion calculation unit 170 can perform the calculation by using the number of bits that is 5 bits smaller than that used when all of the FB signals are targeted for the calculation. Consequently, it is possible to suppress a circuit used for distortion compensation from becoming complicated and an increase in the processing amount, and thus it is possible to suppress an increase in the cost and the size of the wireless communication apparatus 100.

Figure 4:
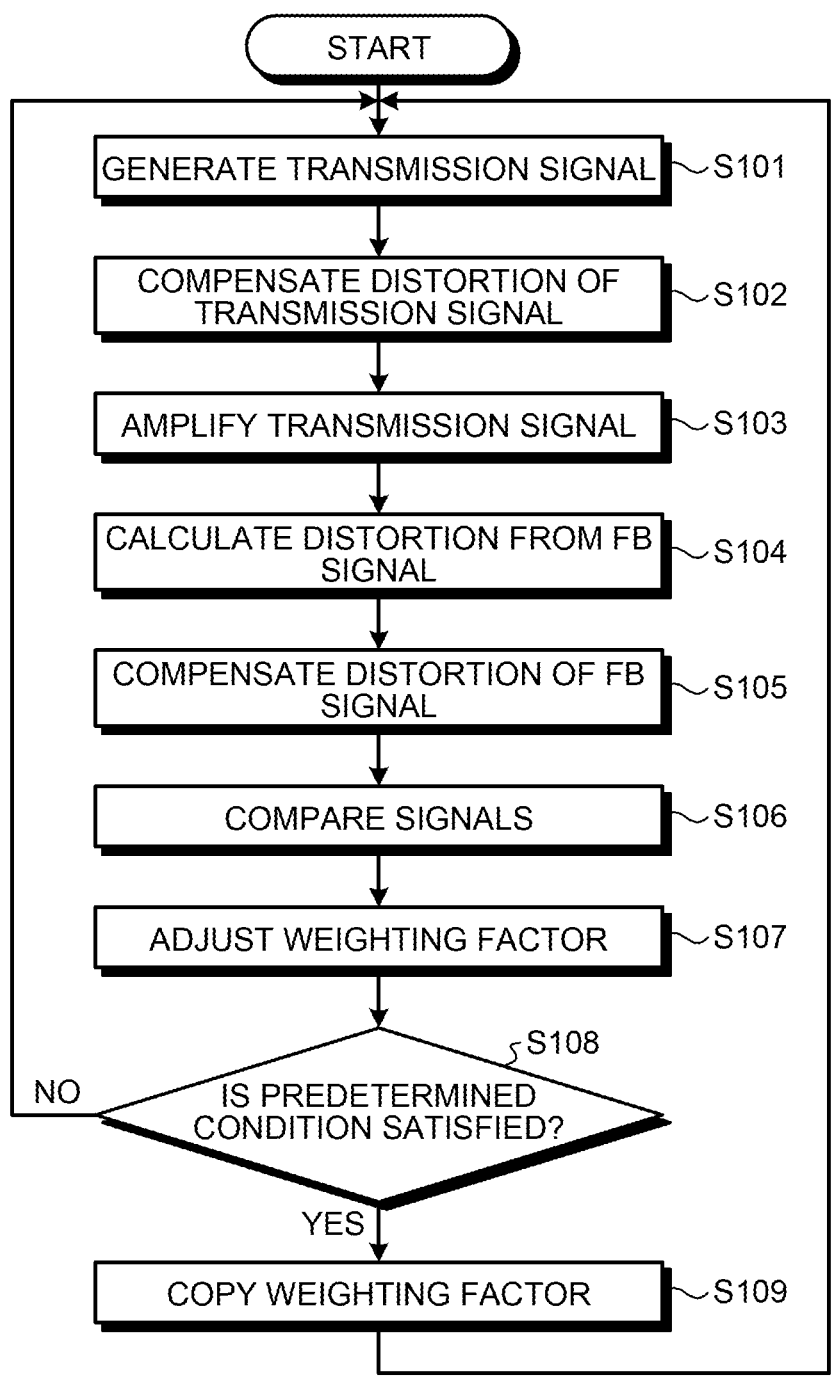
FIG. 4 is a flowchart illustrating a distortion compensation process according to an embodiment.

In the following, a distortion compensation process performed by the wireless communication apparatus 100 that has the configuration described the above will be described with reference to the flowchart illustrated in FIG. 4.

First, a transmission signal is generated by the transmission signal generating unit 110 (Step S101). The generated transmission signal is output to the distortion creating unit 120 and then a distortion component that has the inverse characteristic of inter modulation distortion that is generated in the amplifier 150 is created by the distortion creating unit 120. At this point, the distortion creating unit 120 uses a weighting factor that is copied from the distortion calculation unit 170, whereby a distortion component is created. Then, the adder 130 adds the distortion component to a transmission signal, whereby distortion compensation is performed on the transmission signal (Step S102).

The transmission signal that has been subjected to the distortion compensation is subjected to D/A conversion by the D/A converting unit 140 and then is amplified by the amplifier 150 (Step S103). When the transmission signal is amplified, the distortion component that is given to the transmission signal is canceled out by the inter modulation distortion that is generated in the amplifier 150. The transmission signal that has been amplified by the amplifier 150 is sent via the antenna.

Furthermore, the transmission signal that has been amplified by the amplifier 150 is fed back to the A/D converting unit 160. Then, the FB signal is subjected to A/D conversion by the A/D converting unit 160 and is then output to the distortion calculation unit 170. Then, the distortion calculation unit 170 uses Equation (3) and creates a distortion component having the inverse characteristic of the inter modulation distortion that is generated in the amplifier 150 (Step S104).

At this point, a distortion component is created while the weighting factor $a_{kq}$ used in Equation (3) is being adjusted by the distortion calculation unit 170. Specifically, the weighting factor $a_{kq}$ is adjusted such that the difference output from the subtractor 190 is small.

The distortion component created by the distortion calculation unit 170 is added to an FB signal by the adder 180 and distortion compensation is performed on the FB signal (Step S105). The FB signal that has been subjected to the distortion compensation is compared, by the subtractor 190, with the transmission signal that has been subjected to the distortion compensation (Step S106). Specifically, the difference between the transmission signal that is output from the adder 130 and the FB signal that is output from the adder 180 is calculated by the subtractor 190. The difference calculated at this point is smaller as the weighting factor $a_{kq}$ that is used when a distortion component is calculated is closer to an optimum value.

Then, the difference calculated by the subtractor 190 is output to the distortion calculation unit 170 and then the weighting factor $a_{kq}$ is adjusted by the distortion calculation unit 170 such that the difference is small (Step S107). Furthermore, the distortion calculation unit 170 determines whether a predetermined condition, such as a predetermined time period has elapsed, is satisfied (Step S108). If the predetermined condition is not satisfied (No at Step S108), processes between a process of creating a transmission signal and a process of adjusting the weighting factor $a_{kq}$ are repeatedly performed. As described above, because the weighting factor $a_{kq}$ is repeatedly adjusted such that the difference calculated by the subtractor 190 is small, the weighting factor $a_{kq}$ is converged to an optimum value.

In contrast, if the predetermined condition, such as a predetermined time period has elapsed, is satisfied (Yes at Step S108), the weighting factor $a_{kq}$ that has been adjusted by the distortion calculation unit 170 is copied to the distortion creating unit 120 (Step S109). Consequently, because an optimum weighting factor $a_{kq}$ is used by the distortion creating unit 120 to create a distortion component, it is possible to improve the accuracy of the distortion compensation that is performed on a transmission signal.

As described above, according to the embodiment, when predistortion that uses memory polynomial is performed, a weighting factor of a distortion component is adjusted while calculation targeted for only the distortion component is being performed. Consequently, the weighting factor is adjusted by performing calculation that is targeted for a relatively small distortion component without performing calculation that is targeted for all of the FB signals whose level is relatively large. Consequently, it is possible to prevent an increase in the number of bits used for the calculation and it is possible to suppress a circuit from becoming complicated and an increase in an amount of processing.

Furthermore, the distortion compensation process described in the above embodiment may also be performed by a processor, such as a central processing unit (CPU) and a digital signal processor (DSP), included in the wireless communication apparatus 100. In such a case, the processor executes various kinds of arithmetic processing by allowing a memory to store data or the like that is to be used. Specifically, the processor executes processes performed by, for example, the transmission signal generating unit 110, the distortion creating unit 120, the adder 130, the distortion calculation unit 170, the adder 180, and the subtractor 190 according to the embodiment.

Furthermore, the distortion compensation process described in the above embodiment may also be performed as a program that can be executed by a computer. In such a case, the program may also be stored in a computer readable recording medium and then installed in the computer. Examples of the computer readable recording medium includes a portable recording medium, such as a CD-ROM, a DVD disk, a USB memory, and the like or a semiconductor memory, such as a flash memory and the like.

According to one aspect of an embodiment of the distortion compensation apparatus and the distortion compensation method disclosed by the present application, it is possible to suppress an increase in the size of the apparatus and the cost.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A distortion compensation apparatus that compensates distortion generated in an amplifier that amplifies an input signal, the distortion compensation apparatus comprising:
 a calculation unit that calculates a distortion component that is associated with the distortion generated in the amplifier by using a polynomial including a factor and an output signal from the amplifier;
 an adding unit that adds the distortion component to the output signal from the amplifier; and
 a comparing unit that compares a signal that is obtained by the adding unit, with an input signal input to the amplifier, to which a distortion component is previously given, wherein
 the calculation unit adjusts, on the basis of a comparison result obtained by the comparing unit, the factor that is included in the polynomial.
2. The distortion compensation apparatus according to claim 1, wherein the calculation unit acquires a distortion component that has the inverse characteristic of the distortion that is generated in the amplifier.

3. The distortion compensation apparatus according to claim 1, further comprising:
a creating unit that uses, for a transmission signal, the factor adjusted by the calculation unit and that creates a distortion component that is associated with the distortion generated in the amplifier; and
a distortion compensation unit that gives the distortion component created by the creating unit to a transmission signal and that inputs the transmission signal to the amplifier.

4. The distortion compensation apparatus according to claim 1, wherein the calculation unit adjusts the factor such that a difference between the signals compared by the comparing unit becomes small.

5. A distortion compensation method of compensating distortion generated in an amplifier that amplifies an input signal, the distortion compensation method comprising:
calculating a distortion component that is associated with the distortion generated in the amplifier by using a polynomial including a factor and an output signal from the amplifier;
adding the distortion component to the output signal from the amplifier;
comparing a signal that is obtained at the adding, with an input signal input to the amplifier, to which a distortion component is previously given; and
adjusting, on the basis of a comparison result obtained at the comparing, the factor that is included in the polynomial.

6. A distortion compensation apparatus that compensates distortion generated in an amplifier that amplifies an input signal, the distortion compensation apparatus comprising:
a calculation unit that calculates a distortion component that is associated with the distortion generated in the amplifier by using a following polynomial $$IMD(n) = \sum_{k=2}^{K} \sum_{q=0}^{Q} a_{kq} \cdot y(n-q) \cdot |y(n-q)|^{k-1},$$

where IMD(n) represents the distortion component at time n, $a_{kq}$ represents a factor and y(n) represents an output signal from the amplifier at time n;
an adding unit that adds the distortion component to the output signal from the amplifier; and
a comparing unit that compares a signal that is obtained by the adding unit, with an input signal input to the amplifier, to which a distortion component is previously given, wherein
the calculation unit adjusts, on the basis of a comparison result obtained by the comparing unit, the factor that is included in the polynomial.

7. The distortion compensation apparatus according to claim 6, wherein the calculation unit acquires a distortion component that has the inverse characteristic of the distortion that is generated in the amplifier.

8. The distortion compensation apparatus according to claim 6, further comprising:
a creating unit that uses, for a transmission signal, the factor adjusted by the calculation unit and that creates a distortion component that is associated with the distortion generated in the amplifier; and
a distortion compensation unit that gives the distortion component created by the creating unit to a transmission signal and that inputs the transmission signal to the amplifier.

9. The distortion compensation apparatus according to claim 6, wherein the calculation unit adjusts the factor such that a difference between the signals compared by the comparing unit becomes small.

10. A distortion compensation method of compensating distortion generated in an amplifier that amplifies an input signal, the distortion compensation method comprising:
calculating a distortion component that is associated with the distortion generated in the amplifier by using a following polynomial $$IMD(n) = \sum_{k=2}^{K} \sum_{q=0}^{Q} a_{kq} \cdot y(n-q) \cdot |y(n-q)|^{k-1},$$

where IMD(n) represents the distortion component at time n, $a_{kq}$ represents a factor and y(n) represents an output signal from the amplifier at time n;
adding the distortion component to the output signal from the amplifier;
comparing a signal that is obtained at the adding, with an input signal input to the amplifier, to which a distortion component is previously given; and
adjusting, on the basis of a comparison result obtained at the comparing, the factor that is included in the polynomial.

* * * * *